(12) United States Patent
Fujiki et al.

(10) Patent No.: US 7,417,078 B2
(45) Date of Patent: *Aug. 26, 2008

(54) ELECTROMAGNETIC WAVE ABSORBING THERMALLY CONDUCTIVE COMPOSITION AND THERMOSOFTENING ELECTROMAGNETIC WAVE ABSORBING HEAT DISSIPATION SHEET AND METHOD OF HEAT DISSIPATION WORK

(75) Inventors: Hironao Fujiki, Usui-gun (JP); Kazuhiko Tomaru, Usui-gun (JP); Ikuo Sakurai, Usui-gun (JP); Akio Suzuki, Usui-gun (JP); Kunihiko Mita, Usui-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/250,685

(22) PCT Filed: Mar. 20, 2002

(86) PCT No.: PCT/JP02/02667

§ 371 (c)(1),
(2), (4) Date: Jul. 17, 2003

(87) PCT Pub. No.: WO02/075755

PCT Pub. Date: Sep. 26, 2002

(65) Prior Publication Data

US 2004/0054029 A1 Mar. 18, 2004

(30) Foreign Application Priority Data

Mar. 21, 2001 (JP) ............................. 2001-080870

(51) Int. Cl.
- *G21F 1/10* (2006.01)
- *C08K 3/10* (2006.01)
- *C08K 3/22* (2006.01)
- *C08L 83/06* (2006.01)
- *H05K 7/20* (2006.01)

(52) U.S. Cl. ................... 523/137; 524/431; 524/435; 524/500; 524/588; 165/185; 361/704; 361/705

(58) Field of Classification Search ................. 523/137; 165/80.1, 80.2, 185, 905; 361/704, 705, 361/708, 709; 524/435, 431

See application file for complete search history.

(56) References Cited

U.S. PATENT DOCUMENTS

| | | | |
|---|---|---|---|
| 5,011,870 A * | 4/1991 | Peterson | 523/220 |
| 5,750,045 A * | 5/1998 | Nihira et al. | 252/62.56 |
| 5,945,217 A * | 8/1999 | Hanrahan | 428/389 |
| 6,040,362 A * | 3/2000 | Mine et al. | 523/212 |
| 6,284,363 B1 * | 9/2001 | Maeda et al. | 428/328 |
| 6,391,442 B1 * | 5/2002 | Duvall et al. | 428/348 |
| 6,514,428 B2 * | 2/2003 | Suzuki et al. | 252/74 |
| 6,540,811 B2 * | 4/2003 | Hosoe et al. | 75/348 |
| 2002/0164476 A1 * | 11/2002 | Kahl et al. | 428/328 |
| 2004/0054029 A1 | 3/2004 | Fujiki et al. | |

FOREIGN PATENT DOCUMENTS

| | | |
|---|---|---|
| JP | 62-90909 | 4/1987 |
| JP | 2-189959 | 7/1990 |
| JP | 3-188698 | 8/1991 |
| JP | 5-248788 | 9/1993 |
| JP | 8-213521 | 8/1996 |
| JP | 11-335472 | 12/1999 |
| JP | 2000-114440 | 4/2000 |
| JP | 2000-509209 | 7/2000 |
| JP | 2001-53486 | 2/2001 |
| JP | 2001-118973 | 4/2001 |
| JP | 2001-294752 | 10/2001 |
| JP | 2002-76683 | 3/2002 |
| JP | 2002-129019 | 5/2002 |
| WO | WO 9808364 A1 * | 2/1998 |

OTHER PUBLICATIONS

U.S. Appl. No. 11/527,641, filed Sep. 27, 2006, Mita et al.

* cited by examiner

Primary Examiner—Vasu Jagannathan
Assistant Examiner—Vickey Ronesi
(74) Attorney, Agent, or Firm—Oblon, Spivak, McClelland, Maier & Neustadt, P.C.

(57) ABSTRACT

An electromagnetic wave absorbing heat conductive composition is used to form an electromagnetic wave absorbing heat dissipating article that is placed between a heat generating electronic component which, when operated, generates heat, reaches a temperature higher than room temperature and acts as an electromagnetic wave generating source, and a heat dissipating component. The composition is non-fluid at room temperature prior to operation of the electronic component, but acquires a low viscosity, softens or melts under heat generation during operation of the electronic component, to fluidize at least a surface of the composition so that the composition substantially fills any gaps between the electronic component and the heat-dissipating component.

8 Claims, 1 Drawing Sheet 6 (SHIELDED ROOM)    1 (ELECTROMAGNETIC ANECHOIC CHAMBER)

ELECTROMAGNETIC WAVE ABSORBING THERMALLY CONDUCTIVE COMPOSITION AND THERMOSOFTENING ELECTROMAGNETIC WAVE ABSORBING HEAT DISSIPATION SHEET AND METHOD OF HEAT DISSIPATION WORK

TECHNICAL FIELD

The present invention relates to electromagnetic wave absorbing heat conductive compositions for forming electromagnetic wave absorbing heat dissipating articles that are placed between heat generating electronic components which, when operated, generate heat, attain a temperature higher than room temperature and can become electromagnetic wave-generating sources, and heat dissipating components such as heat sinks and circuit boards so as to cool the electronic components by heat conduction and absorb the electromagnetic waves. The invention relates also to thermosoftening electromagnetic wave absorbing heat dissipating sheets produced from such compositions, and to a method of installing such compositions for the purpose of heat dissipation.

BACKGROUND ART

Circuit design for the latest electronic equipment, including TVs, radios, computers, medical devices, office equipment and telecommunications devices, has become increasingly complex. For example, integrated circuits which contain the equivalent of several hundreds of thousands of transistors are now manufactured for these and other kinds of equipment. This rise in design complexity has been accompanied by a parallel trend toward the fabrication of ever smaller electronic components. That is, manufacturers are finding ways to fit larger numbers of such components on steadily shrinking device footprints while at the same time continuing to reduce the dimensions of the device.

Because heat generated by the various working components causes device malfunctions and inoperability, methods for effectively dissipating heat generated by electronic components are needed.

Such problems associated with heat generation are exacerbated by the increasing levels of integration being achieved in electronic components—particularly central processing units (CPUs), drivers, integrated circuits (ICs), memories and other large-scale integration (LSI) devices—which are used in electronic equipment such as personal computers (PCs), digital video disks (DVDs) and cell phones. Another current trend is a shift toward higher operating frequencies for higher performance. This has led to the generation of harmful electromagnetic waves which can cause failure, malfunction or inoperability due to electromagnetic interference between electronic components, and may have deleterious effects on the human body.

Many heat dissipating methods, as well as heat dissipating articles and compositions used in such methods, have already been devised to reduce the heat generated by electronic components. Heat sinks in the form of plates made of brass and other high thermal conductivity metals are used in electronic equipment to hold down the rise in temperature of electronic components therein during use. These heat sinks carry away heat generated by the electronic components and release that heat from surfaces by means of a temperature difference with outside air.

For heat generated by an electronic component to be efficiently transferred to a heat sink, it is necessary that the heat sink be placed in close contact with the electronic component. Because of height differences among various electronic components and component tolerances in the assembly process, a flexible heat conductive sheet or a heat conductive grease is often placed between the electronic components and the heat sink so that heat transfer from the electronic components to the heat sink takes place through the heat conductive sheet or grease. Heat conductive sheets made of materials such as heat conductive silicone rubber are used for this purpose, but a problem with such sheets is their interfacial thermal resistance.

Methods that have been proposed for lowering the interfacial thermal resistance include the use of heat conductive greases and thermosoftening sheets such as those described in JP-A 2000-509209. However, these prior-art greases and sheets serve only as heat dissipating articles, and lack the ability to absorb electromagnetic waves.

Many attempts have been made to shield out electromagnetic waves generated from electronic components. Such efforts have generally involved the use of metals, platings or electrically conductive compositions, but these materials all rely on the ability to reflect electromagnetic waves. Sheets composed of an organic rubber medium, especially chlorinated polyethylene, which is loaded with a soft magnetic powder or ferrite as the electromagnetic wave absorbing constituent are already available on the market. Yet, such sheets, while having an electromagnetic wave shielding ability, are ineffective for heat dissipation.

Materials endowed with both the ability to conduct heat and the ability to absorb electromagnetic waves have recently been described in the art. For example, JP-A 11-335472 discloses that sheet-like structures fabricated from a matrix material such as silicone gel that contains a ferrite (e.g., Mn—Zn ferrite, Ni—Zn ferrite) have electromagnetic noise suppressing effects. However, because such sheets are loaded with an electromagnetic wave absorbing filler, they are rigid. Moreover, they have a low thermal conductivity and are thus poorly suited for use as heat dissipating articles.

One object of the present invention is to provide electromagnetic wave absorbing heat conductive compositions endowed with both an excellent ability to dissipate heat and outstanding electromagnetic wave absorbing properties which suppress the generation of electromagnetic noise. Another object of the invention is to provide thermosoftening electromagnetic wave absorbing heat dissipating sheets formed from such compositions. An additional object is to provide a method of installing such compositions for the purpose of heat dissipation.

DISCLOSURE OF THE INVENTION

As a result of extensive investigations carried out in order to achieve the above objects, we have found that the interfacial use between a heat generating electronic component and a heat dissipating component of an uncured composition which contains an electromagnetic wave absorbing filler, is a solid at normal temperatures, and thermosoftens, acquires a low viscosity or melts in a given temperature range so as to enable ready formation into a sheet or other necessary shape offers a number of advantages. Such compositions can easily be installed on and removed from electronic components and heat sinks. They soften under the effect of heat generated during operation of the electronic components, reducing interfacial contact thermal resistance and thereby improving the heat dissipating performance. Moreover, they have excellent electromagnetic wave absorbing properties which suppress the generation of electromagnetic noise.

That is, we have discovered that the desired electromagnetic wave absorbing ability and heat dissipation can be achieved by interposing, between a heat generating electronic component and a heat dissipating component, a composition prepared by selecting a constituent which is solid at normal temperatures but thermosoftens, acquires a low viscosity or melts within a fixed temperature range, and loading this constituent with a filler having the ability to absorb electromagnetic waves and, if necessary, a heat conductive filler.

Accordingly, in a first aspect, the invention provides an electromagnetic wave absorbing heat conductive composition for forming an electromagnetic wave absorbing heat dissipating article that is disposed between a heat generating electronic component which when operated generates heat, reaches a temperature higher than room temperature and acts as an electromagnetic wave generating source, and a heat dissipating component. The composition is characterized by being non-fluid in a room temperature state prior to operation of the electronic component and by acquiring a low viscosity, softening or melting under heat generation during operation of the electronic component to fluidize at least a surface of the composition so that the composition substantially fills any gaps between the electronic component and the heat-dissipating component. In a second aspect, the invention provides a thermosoftening electromagnetic wave absorbing heat dissipating sheet fabricated from the foregoing electromagnetic wave absorbing heat conductive composition. In a third aspect, the invention provides a method of applying an electromagnetic wave absorbing heat conductive composition. The method is characterized by placing the foregoing composition between a heat generating electronic component which when operated generates heat, reaches a temperature higher than room temperature and acts as an electromagnetic wave generating source, and a heat dissipating component; and substantially filling any gaps between the electronic component and the heat dissipating component by operating the heat generating electronic component and generating heat, causing the composition to acquire a low viscosity, soften or melt so that at least a surface thereof fluidizes, and by also pressing against the composition from at least the heat generating electronic component or the heat dissipating component.

BEST MODE FOR CARRYING OUT THE INVENTION

Figure 1:
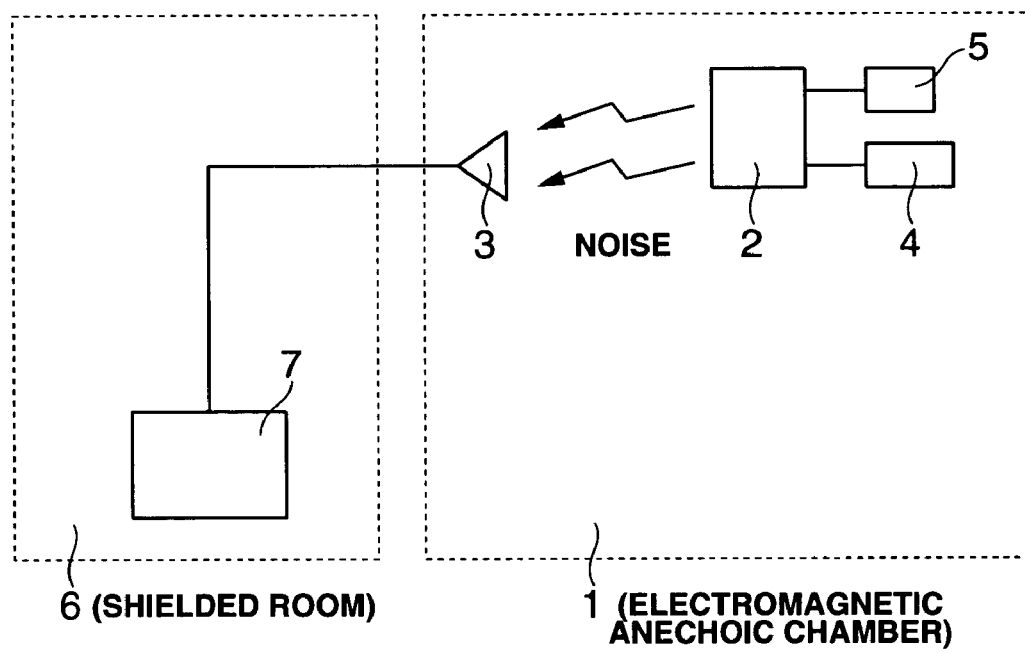
FIG. 1 is a block diagram illustrating a method for measuring noise attenuation.

The invention is described more fully below.

The electromagnetic wave absorbing heat conductive compositions of the invention are used in the form of electromagnetic wave absorbing heat dissipating articles disposed at the interface between a heat generating electronic component which when operated—particularly by the application of a voltage thereto—reaches temperatures higher than room temperature and can act as an electromagnetic wave generating source, and a heat dissipating component. In an ordinary room temperature state prior to operation of the electronic component, the composition is non-fluid and is maintained in the state of a sheet or other shaped article or is held on a base material or the like and thereby maintained in a conveyable state. Heat generated during operation of the electronic component causes the composition to acquire a low viscosity, soften or melt, so that it substantially fills any gaps between the electronic component and a heat dissipating component. It is preferable for gaps between the electronic component and the heat dissipating component to be filled under the application of a pressing force to the electronic component and/or heat dissipating component during heat generation by the electronic component.

The electromagnetic wave absorbing heat conductive compositions of the invention are composed of an organic binder constituent and an electromagnetic wave absorbing filler. When additional thermal conductivity is required, it is preferable for the composition to include, along with the above constituents, a thermally conductive filler. Each of these constituents is described in detail below, as is also a method for preparing the overall composition.

Organic Binder Constituent

Any organic binder constituent may be used as the matrix of the inventive electromagnetic wave absorbing heat conductive composition so long as the composition is substantially solid at normal temperatures and softens, acquires a low viscosity or melts in a temperature range of preferably 40° C. to the maximum temperature reached as a result of heat generation by the heat generating electronic component, more preferably about 40 to 100° C., and most preferably about 40 to 90° C., so that at least the surface of the composition fluidizes. Illustrative examples of suitable organic binder constituents include substances having a melting point within the temperature range of operation, and preferably 40 to 100° C., such as α-olefins, silicone resins and waxes (referred to hereinafter as "low-melting substances"); substances which do not having a melting point within the above temperature range during operation, but which soften or acquire a low viscosity and become fluid at the temperature during operation (referred to hereinafter as "heat-flowable substances"); substances which are syrupy at the above temperature range during operation; and mixtures of thermoplastic resins and/or thermoset resins which melt at a temperature higher than the above-described temperature range during operation or have substantially no melting point in combination with the above-described low-melting substances, heat-flowable substances or syrupy substances (in which cases the overall composition thermosoftens). Mixtures of thermoplastic resins and/or thermoset resins with low-melting substances, heat-flowable substances or syrupy substances are preferred.

It is preferable for the inventive composition to contain, as the organic binder constituent, one or more polyolefin polymer, acrylic polymer, fluoropolymer or siloxane polymer. To induce the composition to thermosoften, acquire a low viscosity or melt without liquefaction and run-off, it is desirable for it to include a low-melting substance, a heat-flowable substance or a syrupy substance. If the composition must be fire retarding, it is desirable for it to include a fluoropolymer or a siloxane polymer. Preferred fluoropolymers include liquid fluorocarbon resins, especially hexafluoropropene/vinylidene fluoride/tetrafluoro-ethylene copolymers. Preferred siloxane polymers include those like silicone resins which are solids at room temperature, but soften, acquire a low viscosity or melt on heating; and those like alkyl-modified silicones which melt at or above room temperature. The inclusion of a silicone resin is preferred. Examples of preferred materials for maintaining a non-fluid state at normal temperatures include polymers containing $RSiO_{3/2}$ units and/or $SiO_2$ units, copolymers of such polymers with $R_2SiO$ units (silicone resins), and mixtures of silicone resins and linear polysiloxanes (uncured silicone rubbers, silicone oils). Here, R stands for monovalent hydrocarbon groups.

As noted above, to effect the critical decrease in viscosity, it is desirable for the composition to contain, for example, an oligomer having a relatively low degree of polymerization or a wax. Specific examples include low-melting substances (e.g., α-olefins, waxes, acrylic oligomers, silicone resins, fluorinated oligomers), heat-flowable substances and syrupy substances. The low-melting substances and heat-flowable substances are preferably substances which melt or soften within a temperature range of 40 to 100° C.

In the present invention, it is particularly advantageous to mix a substance which melts in the above-indicated temperature range during operation (e.g., the above-described α-olefins, waxes, silicone resins) into a polyolefin-type polymer (preferably ethylene-propylene copolymer or ethylene-propylene-diene terpolymer), acrylic polymer, fluoropolymer or siloxane polymer which does not melt in the above-indicated temperature range during operation.

The mixing proportions are not subject to any particular limitation, provided the composition is solid at room temperature, fluidizes under heat generation during operation of the electronic component, and fills any gaps between the heat generating electronic component and the heat dissipating component. However, it is preferable for the organic binder constituent to account for 10 to 100 wt %, and especially 20 to 80 wt %, of the composition.

It is advantageous for the organic binder constituent of the invention to be one which imparts flexibility and tack (essential for temporarily holding the heat dissipating sheet in place on an electronic component or heat sink) to the inventive composition. A polymer or other suitable substance of a single viscosity may be used, although the use of two or more polymers or other suitable substances of differing viscosities in admixture is desirable for achieving a sheet having an excellent balance of flexibility and tack. The use of two or more such substances of differing viscosity is thus preferred.

It is preferable for the above-described polymer or composition to be first thermosoftened or melted, then crosslinked because this can enhance the reworkability. That is, initial thermosoftening of the composition so as to bring it into close contact with the heat generating electronic component and heat dissipating component, followed by crosslinking enable the composition to conform to heat-induced expansion and contraction of the components while maintaining a low thermal resistance. Moreover, when reworkability is required, the fact that the composition is crosslinked enables it to be easily stripped from the electronic components and heat dissipating components. It is thus desirable for the composition be curable by a crosslinking reaction.

To achieve the above ends, it is preferable for the above-described polymers to have terminal or pendant curing reactive functional groups. In polyolefin resins and acrylic resins, typical examples of such functional groups include OH, COOH, unsaturated aliphatic groups, glycidyl groups and norbornene groups. In fluoropolymers, the CH moiety on vinylidene fluoride groups may be used for crosslinking. In siloxane polymers, unsaturated aliphatic groups, silanol groups and alkoxysilyl groups may be used for crosslinking.

Electromagnetic Wave Absorbing Filler

The electromagnetic wave absorbing filler used in the invention is preferably one or more selected from the group consisting of ferromagnetic metal powders and ferromagnetic oxide powders. A ferromagnetic metal powder or a ferromagnetic oxide powder may be used alone, or both types of powder may be used in admixture.

The ferromagnetic metal powder is preferably iron or an iron-containing alloy. The ferromagnetic iron alloy is at least one selected from the group consisting of Fe—Ni, Fe—Co, Fe—Cr, Fe—Si, Fe—Al, Fe—Cr—Si, Fe—Cr—Al, Fe—Al—Si, Fe—B—Si, Ni—Fe and Co—Fe—Ni—Si—B ferromagnetic alloys. Any of these ferromagnetic metal powders may be used alone or combinations of two or more may be used together.

The ferromagnetic metal powder may be composed of particles having either a flaky or granular shape, although flaky particles are preferable for conferring the inventive composition with a good ability to absorb electromagnetic waves. Because a soft magnetic metal powder composed of flaky particles tends to account for a smaller proportion of the composition volume on loading, concomitant use can be made of a soft magnetic metal powder composed of granular particles.

If the ferromagnetic metal powder is composed of flaky particles, it is advantageous for the particles to have an average maximum length of 0.1 to 350 μm, especially 0.5 to 100 μm, and an aspect ratio of 2 to 50. If the ferromagnetic metal powder is made of granular particles, it is advantageous for the particles to have an average particle size of 0.1 to 100 μm, and especially 0.5 to 50 μm.

The ferromagnetic oxide powder is preferably a ferrite. Specific examples of ferrites that may be used include spinel ferrites having a basic composition of $ZnFe_2O_4$, $MnFe_2O_4$, $MgFe_2O_4$, $CoFe_2O_4$, $NiFe_2O_4$, $CuFe_2O_4$, $Fe_3O_4$, Cu—Zn-ferrite, Ni—Zn-ferrite or Mn—Zn-ferrite; X-type and Z-type ferrox-planar hexagonal ferrites having a basic composition of $Ba_2CO_2Fe_{12}O_{22}$, $Ba_2Ni_2Fe_{12}O_{22}$, $Ba_2Zn_2Fe_{12}O_{22}$, $Ba_2Mn_2Fe_{12}O_{22}$, $Ba_2Mg_2Fe_{12}O_{22}$, $Ba_2Cu_2Fe_{12}O_{22}$ or $Ba_3CO_2Fe_{24}O_{41}$; and M-type magnetoplumbite hexagonal ferrites having a basic composition of $BaFe_{12}O_{19}$, $SrFe_{12}O_{19}$ and/or $BaFe_{12}O_{19}$ or $SrFe_{12}O_{19}$ in which the iron is substituted with titanium, cobalt, manganese, copper, zinc, nickel or magnesium. Any one or combinations of two or more of these ferrites may be used.

The ferromagnetic oxide powder may be composed of particles having either a flaky or granular shape, although flaky particles are preferable on account of their large surface area. Because a magnetic oxide powder composed of flaky particles tends to account for a smaller proportion of the composition volume on loading, concomitant use can be made of a magnetic oxide powder composed of granular particles.

If the ferromagnetic oxide powder is composed of flaky particles, it is advantageous for the particles to have an average maximum length of 0.1 to 350 μm, especially 0.5 to 100 μm, and an aspect ratio of 2 to 50. If the ferromagnetic oxide powder is composed of granular particles, it is advantageous for the particles to have an average particle size of 0.1 to 100 μm, and especially 0.5 to 50 μm.

These electromagnetic wave absorbing fillers are included in an amount of preferably 100 to 3,000 parts by weight, and most preferably 150 to 1,600 parts by weight, per 100 parts by weight of the organic binder constituent. The addition of too little electromagnetic wave absorbing filler may fail to impart the composition with a sufficient electromagnetic wave absorbing ability. On the other hand, too much of this filler may result in poor fluidity when the composition softens, acquires a low viscosity or melts at the time of heat generation and also render the composition hard and brittle at room temperature, making the composition difficult to form into a sheet.

Heat Conductive Filler

If the formulation of only the foregoing matrix and electromagnetic wave absorbing filler provides inadequate heat conduction and a greater heat dissipating effect is desired, a heat conductive filler may be used together with the above constituents.

Examples of heat conductive fillers that may be used in the practice of the invention include the following substances commonly employed as heat conductive fillers: nonmagnetic metals such as copper and aluminum, metal oxides such as alumina, silica, magnesia, red iron oxide, beryllia, titania and zirconia; metal nitrides such as aluminum nitride, silicon nitride and boron nitride; artificial diamond and silicon carbide. These heat conductive fillers may be used singly or as combinations of two or more thereof.

As with the electromagnetic wave absorbing fillers, these heat conductive fillers preferably have an average particle size of 0.1 to 100 μm, and especially 0.5 to 50 μm. The particle shape is preferably round. Use may be made of heat conductive filler having one particle shape or having a plurality of different particle shapes in admixture. To enhance thermal conductivity, it is recommended that particles of two or more different average particle sizes be blended so as to approach a closest packing arrangement.

The heat conductive filler is included in an amount of preferably 10 to 2,500 parts by weight, and most preferably 1,000 to 2,000 parts by weight, per 100 parts by weight of the organic binder constituent. Too little heat conductive filler may fail to provide a sufficient heat conducting ability, whereas too much may detract from the sheet formability of the composition and its ease of use.

Other Additives

The electromagnetic wave absorbing heat conductive compositions of the invention may optionally include also other constituents, such as additives and fillers that are commonly used in synthetic rubbers, insofar as this does not compromise the objects of the invention. Specific examples of such additional constituents that may be used include release agents such as silicone oils and fluorine-modified silicone surfactants; colorants such as carbon black, titanium dioxide and red iron oxide; flame retardants such as halogen compounds, phosphorus compounds and platinum catalysts; and processing aids used when formulating conventional rubbers and plastics, such as process oils, reactive silanes or siloxanes, reactive titanate catalysts and reactive aluminum catalysts.

Method of Preparation

The electromagnetic wave absorbing heat conductive compositions of the invention can be prepared by using a rubber blending apparatus such as a two-roll mill, Banbury mixer, kneader, gate mixer or planetary mixer, and heating if necessary, to uniformly blend the above constituents.

Thermosoftening electromagnetic wave absorbing heat dissipating sheets can be produced using a process in which the composition obtained by blending is then formed into a sheet by a suitable technique such as extrusion, calendering, rolling, pressing, or dissolution in a solvent followed by coating.

The resulting electromagnetic wave absorbing heat conductive composition and thermosoftening electromagnetic wave absorbing heat dissipating sheet have a thermal conductivity of preferably at least 0.5 W/mK, and most preferably 1 to 20 W/mK. At a thermal conductivity of less than 0.5 W/mK, the ability to conduct heat between an electronic component and a heat sink or other heat dissipating component decreases so that the composition or sheet may fail to exhibit a sufficient heat dissipating ability.

It is preferable for the composition and sheet of the invention to have a viscosity at 80° C. of $1\times10^2$ to $1\times10^5$ Pa·s, and especially $5\times10^2$ to $5\times10^4$ Pa·s. At a viscosity of less than $1\times10^2$ Pa·s, run-off of the composition or sheet from between an electronic component and a heat dissipating component such as a heat sink may occur. On the other hand, at a viscosity of more than $1\times10^5$ Pa·s, the contact thermal resistance may increase, lowering the ability to conduct heat between an electronic component and a heat dissipating component such as a heat sink. In such cases, the composition or sheet exhibits an inadequate heat dissipating ability.

Moreover, it is desirable for the above composition and sheet to have a plasticity at 25° C. (JIS K 6200) in a range of 100 to 700, and preferably 200 to 600. At a plasticity at 25° C. of less than 100, handleability during installation on electronic components may be poor. At a value greater than 700, sheet formability and handleability during installation on electronic components may be poor.

The resulting electromagnetic wave absorbing heat conductive composition and thermosoftening sheet can easily be installed on and removed from electronic components and heat dissipating components such as heat sinks. They acquire a low viscosity, soften or melt under the effect of heat generated during operation of the electronic components so that at least the surface of the composition fluidizes, thereby reducing interfacial contact thermal resistance between the electronic components and the heat dissipating components. Moreover, they have an excellent electromagnetic wave absorbing ability which suppresses the generation of electromagnetic noise.

The above-described composition and sheet are placed between a heat generating electronic component which generates heat as a result of operation, attains a temperature higher than room temperature and becomes an electromagnetic wave generating source, and a heat dissipating component. At the time of installation, the composition or sheet is not set in fully intimate contact with the electronic component; instead, small gaps remain. However, heat generated by operation of the electronic component causes the composition or sheet to soften, acquire a low viscosity or melt to fluidize at least the surface of the composition or sheet so that the composition or sheet fills the small gaps and comes fully into intimate contact with the electronic component. As noted above, this has the effect of lowering the interfacial contact thermal resistance. It is desirable to achieve even closer contact by applying a pressing force at this time to the composition or sheet from at least the electronic component or the heat dissipating component.

The type of heat generating electronic component is not subject to any particular limitation, although the inventive composition or sheet is effective when used with heat generating electronic components that generate electromagnetic waves and heat upon the application thereto of a voltage, such as those used in personal computers and other electronic equipment.

EXAMPLE

Examples of the invention and comparative examples are given below by way of illustration and not by way of limitation.

Examples 1 to 4

Acrylic-based electromagnetic wave absorbing heat conductive compositions composed of a mixture of primarily acrylic resin and electromagnetic wave absorbing fillers and having a softening point of at least 40° C. were formed as described below into thermosoftening electromagnetic wave absorbing heat dissipating sheets.

In each case, an acrylic resin was used as the resin constituent of the acrylic-based electromagnetic wave absorbing heat conductive composition and paraffin wax was used as the thermosoftening constituent. Another ingredient included in the compositions was carbon functional silane, which was used as a surface treatment agent for the electromagnetic wave absorbing filler and the heat conductive filler. The starting materials from which the compositions were formulated are listed below.

Starting Materials
1) Paraffin wax: Paraffin Wax 115 (melting point, 47° C.) and Paraffin Wax 130 (melting point, 55° C.) manufactured by Nippon Seiro Co., Ltd.
2) Acrylic resin: SK Dyne 1310 (32 to 34% insolubles, with the balance being solvent), produced by Soken Chemical & Engineering Co., Ltd.
3) Surface treatment agent for powder: carbon functional silane (KBM-3101, produced by Shin-Etsu Chemical Co., Ltd.)
4) Heat conductive filler: alumina powder (AS30, produced by Showa Denko K.K.)
5) Electromagnetic wave absorbing filler: Fe—Cr produced under the trade name PMIC-15 (a soft magnetic metal powder composed of round particles) by Daito Steel Co., Ltd.
6) Electromagnetic wave absorbing filler: Fe—Cr produced under the trade name PMIC-15F (a soft magnetic metal powder composed of flaky particles) by Daito Steel Co., Ltd.

Fabrication and Performance Evaluation of Thermosoftening Electromagnetic Wave Absorbing Heat Dissipating Sheet The starting materials were added to a homogenizer in the proportions shown in Table 1 and agitated at room temperature for one hour to effect mixture. Using a comma coater, the resulting mixture was applied onto a release agent-coated PET film, then heated in a 100° C. atmosphere for 10 minutes to remove the solvent (volatiles), thereby forming a sheet having a width of 300 mm and a thickness of 0.5 mm.

Samples were punched in a given shape from the resulting thermosoftening electromagnetic wave absorbing heat dissipating sheet. The PET film was peeled off each sample, following which noise attenuation, plasticity, thermal conductivity, thermal resistance, viscosity and the heat softening temperature were measured as described below.

1) Noise Attenuation

The measurement method is illustrated in the block diagram shown in FIG. 1.

A personal computer (PC) 2 in which a thermosoftening electromagnet wave absorbing heat dissipating sheet of the invention (30 mm wide, 30 mm long, 0.5 mm thick) had been inserted between the CPU (operating frequency, 533 MHz) and an aluminum heat sink was placed in an electromagnetic anechoic chamber 1. A receiving antenna 3 was positioned three meters away from the PC 2 to comply with 3-meter testing according to the Federal Communication Commission (FCC). Also shown in FIG. 1 are a display 4 and a keyboard 5. The PC 2 was started up, and the noise generated by the PC 2 was measured with an EMI receiver (spectrum analyzer) 7 located within a shielded room 6 and connected to the receiving antenna 3. During the test, the power on the display 4 connected to the PC 2 was turned off to prevent noise reception from the display 4.

2) Plasticity

Plasticity was measured in accordance with the plasticity test described in JIS K-6249.

3) Thermal Conductivity

Measurement was carried out with a thermal conductivity meter (QTM-500, made by Kyoto Denki).

4) Thermal Resistance

A 0.5 mm thick sample punched from the sheet in the shape of a TO-3 transistor was placed between a transistor (2SD923, from Fuji Electric Co., Ltd.) and a heat sink (FBA-150-PS, OS Co., Ltd.), and a compressive load of 300 gf/cm² was applied. The heat sink was placed in a constant-temperature water bath and held at 60° C. Next, 10V, 3 A power was fed to the transistor, the temperatures of thermocouples embedded in the transistor (temperature $T_1$) and the heat sink (temperature $T_2$) were measured after 5 minutes, and the thermal resistance Rs (in ° C./W) of the sample was computed as follows.

$$Rs=(T_1-T_2)/30$$

5) Viscosity

The viscosity was measured using an ARES viscoelastic measurement system (Rheometric Scientific).

6) Thermosoftening Point

Measured using the Vicat softening temperature test method described in JIS K 7206.

In addition, the sheet formability, flexibility, tack and handleability of the above thermosoftening electromagnetic wave absorbing heat dissipating sheets were each rated as "excellent," "good," "fair" or "poor" based on the following criteria. The results are presented in Table 1.

Sheet Formability: The extrudablity was evaluated.

Flexibility: Rated according to the degree of crack formation when the sheet was bent 90°.

Figure 2:
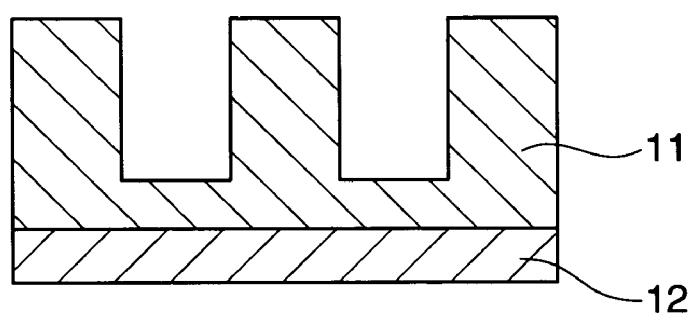
FIG. 2 is a diagram showing a method for evaluating tack.

Tack: As shown in FIG. 2, the heat dissipating sheet 12 was attached to the surface of a heat sink 11. This arrangement was held up in the air for 5 minutes with the heat dissipating sheet 12 on the bottom, and the tack was rated based on whether the sheet peeled and fell off.

Handleability: The ease of manually installing the sheet on the heat sink was evaluated.

TABLE 1

| Starting materials (parts by weight) | Example 1 | Example 2 | Example 3 | Example 4 |
|---|---|---|---|---|
| Paraffin Wax 115 | 0 | 50 | 0 | 50 |
| Paraffin Wax 130 | 50 | 0 | 50 | 0 |
| SK Dyne 1310 | 150 | 150 | 150 | 150 |
| KBM-3103 | 5 | 5 | 5 | 5 |
| AS30 | 0 | 600 | 0 | 300 |
| PMIC-15 | 900 | 900 | 0 | 0 |
| PMIC-15F | 0 | 0 | 350 | 350 |
| Noise attenuation at 1 GHz (dB) | −11.2 | −8.8 | −13.5 | −12.1 |
| Plasticity at 25° C. | 310 | 500 | 250 | 300 |
| Thermal conductivity (W/mK) | 1.3 | 3.8 | 0.9 | 1.8 |
| Thermal resistance at 60° C. (° C./W) | 0.09 | 0.03 | 0.10 | 0.06 |
| Viscosity at 80° C. (Pa·s) | $5 \times 10^3$ | $3 \times 10^4$ | $2 \times 10^3$ | $1 \times 10^4$ |
| Thermosoftening point (° C.) | 40-80 | 40-80 | 40-80 | 40-80 |
| Sheet formability | good | good | good | good |
| Flexibility | excellent | fair | excellent | good |
| Tack | excellent | good | excellent | excellent |
| Handleability | fair | fair | fair | fair |

Examples 5 to 8

Fluorocarbon resin-based electromagnetic wave absorbing heat conductive compositions composed of a mixture of primarily fluorocarbon resin and electromagnetic wave absorbing fillers and having a softening point of at least 40° C. were formed as described below into thermosoftening electromagnetic wave absorbing heat dissipating sheets.

In each case, a liquid fluorocarbon resin was used as the resin constituent of the fluorocarbon resin-based electromagnetic wave absorbing heat conductive composition and a polyvinylidene fluoride/hexafluoropropylene/tetra-fluoroethylene ternary resin was used as the thermosoftening constituent. Another ingredient included in the compositions was carbon functional silane, which was used as a surface treatment agent for the electromagnetic wave absorbing filler and the heat conductive filler. The starting materials from which the compositions were formulated are listed below.

Starting Materials
1) Kynar 9301 (heat softening temperature, 80° C.) manufactured by Daikin Industries, Ltd.
2) Liquid fluorocarbon resin: G101 (Daikin Industries, Ltd.)
3) Surface treatment agent for powder: carbon functional silane (KBM-3101, produced by Shin-Etsu Chemical Co., Ltd.)
4) Heat conductive filler: alumina powder (AS30, produced by Showa Denko K.K.)
5) Electromagnetic wave absorbing filler: Fe—Cr produced under the trade name PMIC-15 (a soft magnetic metal powder composed of round particles) by Daito Steel Co., Ltd.
6) Electromagnetic wave absorbing filler: Fe—Cr produced under the trade name PMIC-15F (a soft magnetic metal powder composed of flaky particles) by Daito Steel Co., Ltd.

Fabrication and Performance Evaluation of Thermosoftening Electromagnetic Wave Absorbing Heat Dissipating Sheet The starting materials were stirred and mixed in a kneader in the proportions shown in Table 2. Using an extruder, the resulting compound was extruded as a 300 mm wide, 0.5 mm thick sheet onto a PET film.

Samples were punched in a given shape from the resulting thermosoftening electromagnetic wave absorbing heat dissipating sheet. The PET film was peeled off each sample, following which noise attenuation, plasticity, thermal conductivity, thermal resistance, viscosity and the heat softening temperature were measured in the same way as in Example 1. In addition, the sheet formability, flexibility, tack and handleability of each sheet were evaluated as in Example 1. The results are presented in Table 2 below.

TABLE 2

| Starting materials (parts by weight) | Example 5 | Example 6 | Example 7 | Example 8 |
|---|---|---|---|---|
| Kynar 9301 | 0 | 100 | 0 | 100 |
| G101 | 200 | 100 | 200 | 100 |
| KBM-3103 | 5 | 5 | 5 | 5 |
| AS30 | 0 | 600 | 0 | 300 |
| PMIC-15 | 1000 | 1000 | 0 | 0 |
| PMIC-15F | 0 | 0 | 450 | 450 |
| Noise attenuation at 1 GHz (dB) | −13.2 | −9.8 | −14.5 | −13.1 |
| Plasticity at 25° C. | 310 | 500 | 250 | 300 |
| Thermal conductivity (W/mK) | 1.7 | 4.4 | 1.2 | 2.1 |
| Thermal resistance at 60° C. (° C./W) | 0.09 | 0.03 | 0.10 | 0.06 |
| Viscosity at 80° C. (Pa · s) | $5 \times 10^3$ | $3 \times 10^4$ | $2 \times 10^3$ | $1 \times 10^4$ |
| Thermosoftening point (° C.) | 40–80 | 40–80 | 40–80 | 40–80 |
| Sheet formability | good | good | good | good |
| Flexibility | excellent | fair | excellent | good |
| Tack | excellent | good | excellent | excellent |
| Handleability | fair | fair | fair | fair |

Examples 9 to 18, and Comparative Example 1

Silicone-based electromagnetic wave absorbing heat conductive compositions composed of a mixture of primarily silicone resin and electromagnetic wave absorbing fillers and having a softening point of at least 40° C. were formed as described below into thermosoftening electromagnetic wave absorbing heat dissipating sheets.

In each case, a methyl phenyl silicone resin which is a copolymer obtained by combining the structural units $CH_3SiO_{3/2}$, $(CH_3)_2SiO$, $C_6H_5SiO_{3/2}$, $(C_6H_5)(CH_3)SiO$ and $(C_6H_5)_2SiO$ was used as the thermosoftening constituent in the silicone-based electromagnetic wave absorbing heat conductive composition. Two vinyl group-bearing dimethylpolysiloxanes of differing viscosities were used as the matrix constituents. The composition also included, as a surface treatment agent for the electromagnetic wave absorbing filler and the heat conductive filler, an organopolysiloxane containing silicon atom-bonded alkoxy groups of general formula (1) below

(1)

In the formula, $R^1$ is $CH_3$ or OH; $R^2$ is $Si(OCH_3)_3$, $Si(OC_2H_5)_3$, $Si(CH_3)_2OH$ or $Si(CH_3)_2NH_2$; and m is any integer from 1 to 100.

To improve peelability from the liner at the time of sheet installation, dimethyldiphenylpolysiloxane was used as an internal release agent. The starting materials from which the compositions were formulated are listed below.

Starting Materials
1) Thermosoftening ingredients: methyl phenyl silicone resins (copolymers obtained by combining the structural units $CH_3SiO_{3/2}$, $(CH_3)_2SiO$, $C_6H_5SiO_{3/2}$, $(C_6H_5)(CH_3)SiO$ and $(C_6H_5)_2SiO$). Resins having softening temperatures of 40° C. (Resin A) and 60° C. (Resin B) were prepared and used.
2) Matrix ingredients: Two types of vinyl group-bearing dimethylpolysiloxane were used.
   High-viscosity ingredient: uncured rubber (KE-76 VBS, produced by Shin-Etsu Chemical Co., Ltd.)
   Low-viscosity ingredient: 30,000 cSt vinyl group-bearing dimethylpolysiloxane oil (Shin-Etsu Chemical Co., Ltd.)

3) Surface treatment agent for powder: The silicon atom-bonded alkoxy group-bearing organopolysiloxane $(CH_3)_3SiO[Si(CH_3)_2O]_{30}Si(OCH_3)_3$ produced by Shin-Etsu Chemical Co., Ltd.
4) Internal release agent: Dimethyldiphenylpolysiloxane (KF-54, produced by Shin-Etsu Chemical Co., Ltd.)
5) Heat conductive filler: alumina powder (AS30, produced by Showa Denko K.K.)
6) Heat conductive filler: aluminum nitride powder (UM, produced by Toyo Aluminum K.K.)
7) Heat conductive filler: silicon carbide powder (GP#1000, produced by Shinano Electric Refining Co., Ltd.)
8) Electromagnetic wave absorbing filler: Fe—Cr produced under the trade name PMIC-15 (a soft magnetic metal powder composed of round particles) by Daito Steel Co., Ltd.
9) Electromagnetic wave absorbing filler: Fe—Cr produced under the trade name PMIC-15F (a soft magnetic metal powder composed of flaky particles) by Daito Steel Co., Ltd.
10) Electromagnetic wave absorbing filler: Mn—Zn ferrite produced under the trade name BSF547 (a soft magnetic oxide powder composed of flaky particles) by Toda Kogyo Corporation
11) Electromagnetic wave absorbing filler: Fe—Ni produced under the trade name MHT Permalloy PC (a soft magnetic metal powder composed of round particles) by Mitsubishi Steel Mfg. Co., Ltd.
12) Electromagnetic wave absorbing filler: Fe—Cr—Si produced under the trade name MHT410L-3Si (a soft magnetic metal powder composed of round particles) by Mitsubishi Steel Mfg. Co., Ltd.

To improve reworkability, in an example where the silicone matrix of the thermosoftening electromagnetic absorbing heat dissipating sheet is crosslinked by the heat generated from operation of the heat generating electronic component (Example 18), an organohydrogenpolysiloxane bearing at least two hydrogen atoms bonded to a silicon atom on the molecule, a platinum group metal catalyst and an acetylene alcohol-based reaction regulator were also added and admixed.

Fabrication and Performance Evaluation of Thermosoftening Electromagnetic Wave Absorbing Heat Dissipating Sheet The starting materials were added to a planetary mixer in the proportions shown in Tables 3 and 4, and stirred at 120° C. for two hours to effect mixture. The mixture was then deaerated and mixed at room temperature in a two-roll mill. Using an extruder, the resulting compound was extruded as a 100 mm wide, 0.5 mm thick sheet. In Example 18 in which the silicone matrix was crosslinked, extrusion of the compound as a 100 mm wide, 0.5 mm thick sheet was preceded by the room temperature addition and admixture in the two-roll mill of the organohydrogenpolysiloxane bearing at least two hydrogen atoms bonded to a silicon atom on the molecule, the platinum group metal catalyst and the acetylene alcohol-based reaction regulator.

Samples were punched in a given shape from the resulting thermosoftening electromagnetic wave absorbing heat dissipating sheets, following which noise attenuation, plasticity, thermal conductivity, thermal resistance, viscosity and the heat softening temperature were measured in the same way as in Example 1. In addition, the sheet formability, flexibility, tack and handleability of each sheet were evaluated as in Example 1. The results are presented below in Tables 3 and 4.

TABLE 3

| Starting materials (parts by weight) | Example 9 | Example 10 | Example 11 | Example 12 | Example 13 | Example 14 |
|---|---|---|---|---|---|---|
| Resin A | 25 | 25 | 25 | 25 | 25 | 25 |
| Resin B | 0 | 0 | 0 | 0 | 0 | 0 |
| KE-76VBS | 10 | 10 | 10 | 10 | 10 | 10 |
| 30,000 cSt vinyl-bearing dimethylpolysiloxane oil | 40 | 40 | 40 | 40 | 40 | 40 |
| Silicon atom-bonded alkoxy-bearing organopolysiloxane | 20 | 20 | 20 | 20 | 20 | 20 |
| KF-54 | 5 | 5 | 5 | 5 | 5 | 5 |
| AS30 | 0 | 400 | 0 | 0 | 0 | 0 |
| UM | 0 | 0 | 400 | 0 | 0 | 0 |
| GP#1000 | 0 | 0 | 0 | 400 | 0 | 0 |
| PMIC-15 | 900 | 900 | 900 | 900 | 0 | 0 |
| PMIC-15F | 0 | 0 | 0 | 0 | 350 | 0 |
| BSF547 | 0 | 0 | 0 | 0 | 0 | 900 |
| Noise attenuation at 1 GHz (dB) | −11.2 | −10.1 | −10.5 | −9.8 | −13.5 | −8.8 |
| Plasticity at 25° C. | 310 | 410 | 450 | 460 | 260 | 300 |
| Thermal conductivity (W/mK) | 1.1 | 2.5 | 3.6 | 2.7 | 0.8 | 2.4 |
| Thermal resistance at 60° C. (° C./W) | 0.09 | 0.06 | 0.04 | 0.09 | 0.10 | 0.06 |
| Viscosity at 80° C. (Pa·s) | $2 \times 10^3$ | $1 \times 10^4$ | $2 \times 10^4$ | $3 \times 10^4$ | $1 \times 10^3$ | $3 \times 10^3$ |
| Thermosoftening point (° C.) | 40-60 | 40-60 | 40-60 | 40-60 | 40-60 | 40-60 |
| Sheet formability | good | good | good | good | good | good |
| Flexibility | excellent | fair | fair | fair | excellent | good |
| Tack | good | fair | good | good | good | fair |
| Handleability | good | fair | fair | fair | fair | good |

TABLE 4

| Starting materials (parts by weight) | Example 15 | Example 16 | Example 17 | Example 18 | Comparative Example 1 |
|---|---|---|---|---|---|
| Resin A | 25 | 0 | 25 | 25 | 25 |
| Resin B | 0 | 25 | 0 | 0 | 0 |
| KE-76VBS | 25 | 10 | 10 | 10 | 10 |
| 30,000 cSt vinyl-bearing dimethylpolysiloxane oil | 40 | 40 | 40 | 40 | 40 |
| Silicon atom-bonded alkoxy-bearing organopolysiloxane | 10 | 20 | 20 | 20 | 20 |
| KF-54 | 5 | 5 | 5 | 5 | 5 |
| Organohydrogenpolysiloxane | 0 | 0 | 0 | 2.0 | 0 |
| Platinum group metal catalyst | 0 | 0 | 0 | 0.2 | 0 |
| Acetylene alcohol-based reaction regulator | 0 | 0 | 0 | 0.4 | 0 |
| AS30 | 0 | 0 | 0 | 400 | 1200 |
| UM | 0 | 0 | 0 | 0 | 0 |
| GP#1000 | 0 | 0 | 0 | 0 | 0 |
| PMIC-15 | 900 | 900 | 400 | 600 | 0 |
| PMIC-15F | 0 | 0 | 150 | 0 | 0 |
| BSF547 | 0 | 0 | 0 | 300 | 0 |
| Noise attenuation at 1 GHz (dB) | −10.7 | −11.1 | −11.2 | −10.7 | 0 |
| Plasticity at 25° C. | 410 | 330 | 290 | 410 | 350 |
| Thermal conductivity (W/mK) | 1.2 | 1.3 | 1.0 | 2.5 | 4.1 |
| Thermal resistance at 60° C. (° C./W) | 0.04 | 0.10 | 0.08 | 0.06 | 0.03 |
| Viscosity at 80° C. (Pa·s) | $8 \times 10^3$ | $5 \times 10^3$ | $5 \times 10^3$ | $1 \times 10^4$ | $5 \times 10^4$ |
| Thermosoftening point (° C.) | 40-60 | 60-80 | 40-60 | 40-60 | 40-60 |
| Sheet formability | good | good | fair | good | good |
| Flexibility | good | excellent | excellent | good | good |
| Tack | good | good | good | fair | good |
| Handleability | good | fair | good | good | good |

To evaluate the reworkability, the thermosoftening electromagnetic wave absorbing heat dissipating sheet was set between a heat sink and a CPU, and the CPU was operated for 3 hours, following which the ease of removing the sheet from the heat sink and the CPU was determined. In Example 18, the fact that the sheet was crosslinked improved the reworkability. Remnants of the sheet that remained on the CPU and heat sink were easily and completely removed by wiping with a dry cloth.

Examples 19 to 31, and Comparative Examples 2 to 4

Polyolefin-based electromagnetic wave absorbing heat conductive compositions composed of a mixture of primarily polyolefin and electromagnetic wave absorbing fillers and having a softening point of at least 40° C. were formed as described below into thermosoftening electromagnetic wave absorbing heat dissipating sheets.

In each of these examples, an α-olefin of general formula (2)

$$CH_2=CH(CH_2)_nCH_3 \quad (2),$$

wherein n is 16 to 50, was used as the thermosoftening ingredient in the polyolefin-based electromagnetic wave absorbing heat conductive composition. The ethylene/α-olefin/non-conjugated polyene random copolymer rubbers of general formulas (3) and (4) below were used as the matrix constituents.

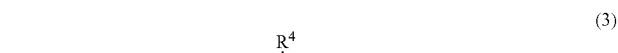

(3)

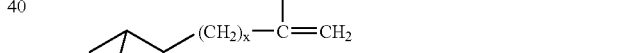

(4)

In formula (3), the letter x represents an integer from 0 to 10, $R^3$ is a hydrogen or an alkyl having 1 to 10 carbons, and $R^4$ is a hydrogen or an alkyl having 1 to 5 carbons. In formula (4), $R^5$ is a hydrogen or an alkyl having 1 to 10 carbons.

To impart the sheet with flexibility and tack, the compositions also included polymers of general formula (5)

$$[(CH_2-CH_2)_X-(CH_2-CRH)_Y]_P \quad (5)$$

and of differing viscosities. In formula (5), R is an alkyl represented by the formula $C_WH_{2W+1}$; and X, Y, P and W are integers, such that generally X is 1 to 100, Y is 5 to 100, P is 5 to 500 and W is 1 to 10. The starting materials from which the compositions were formulated are listed below.

Starting Materials
1) Matrix ingredients: Ethylene/α-olefin/non-conjugated polyene random copolymers EPT-PX055 (Mooney viscosity at 100° C., 8; ethylene content, 58 wt %) produced by Mitsui Chemicals, Inc.
EPT-4010 (Mooney viscosity at 100° C., 8; ethylene content, 65 wt %) produced by Mitsui Chemicals, Inc.
EPT-4021 (Mooney viscosity at 100° C., 24; ethylene content, 67 wt %) produced by Mitsui Chemicals, Inc.
EPT-X3012P (Mooney viscosity at 100° C., 15; ethylene content, 70 wt %) produced by Mitsui Chemicals, Inc.

2) Matrix ingredients: ethylene/α-olefin copolymers
Lucant HC40 (viscosity at 25° C., 350 cSt) produced by Mitsui Chemicals, Inc.
Lucant HC3000X (viscosity at 25° C., 25,000 cSt) produced by Mitsui Chemicals, Inc.
Lucant HC10 (viscosity at 25° C., 140 cSt) produced by Mitsui Chemicals, Inc.

3) Thermosoftening ingredients: α-olefins
DIALEN 30 (n=30 to 40) produced by Mitsubishi Chemical Corp.
DIALEN 208 (n=17 to 25) produced by Mitsubishi Chemical Corp.

4) Heat conductive filler: alumina powder (AS30, produced by Showa Denko K.K.)
5) Heat conductive filler: aluminum nitride powder (UM, produced by Toyo Aluminum K.K.)
6) Heat conductive filler: silicon carbide powder (GP#1000, produced by Shinano Electric Refining Co., Ltd.)
7) Electromagnetic wave absorbing filler: Fe—produced under the trade name PMIC-15 (a soft magnetic metal powder composed of round particles) by Daito Steel Co., Ltd.
8) Electromagnetic wave absorbing filler: Fe—Cr produced under the trade name PMIC-15F (a soft magnetic metal powder composed of flaky particles) by Daito Steel Co., Ltd.
9) Electromagnetic wave absorbing filler: Mn—Zn ferrite produced under the trade name BSF547 (a soft magnetic oxide powder composed of flaky particles) by Toda Kogyo Corporation
10) Electromagnetic wave absorbing filler: Fe—Ni produced under the trade name MHT Permalloy PC (a soft magnetic metal powder composed of round particles) by Mitsubishi Steel Mfg. Co., Ltd.
12) Electromagnetic wave absorbing filler: Fe—Cr—Si produced under the trade name MHT410L-3Si (a soft magnetic metal powder composed of round particles) by Mitsubishi Steel Mfg. Co., Ltd.
12) Surface treatment agent for powder: carbon functional silane (KBM-3101, produced by Shin-Etsu Chemical Co., Ltd.)

Fabrication and Performance Evaluation of Thermosoftening Electromagnetic Wave Absorbing Heat Dissipating Sheet The starting materials were added to a planetary mixer in the proportions shown in Tables 5 and 6, and stirred at 100° C. for two hours to effect mixture. The mixture was then deaerated and mixed at room temperature in a two-roll mill. Using an extruder, the resulting compound was extruded as a 100 mm wide, 0.5 mm thick sheet.

Samples were punched in a given shape from the resulting thermosoftening electromagnetic wave absorbing heat dissipating sheets, following which noise attenuation, plasticity, thermal conductivity, thermal resistance, viscosity and the heat softening temperature were measured in the same way as in Example 1. In addition, the sheet formability, flexibility, tack and handleability of each sheet were evaluated as in Example 1. The results are presented below in Tables 5 and 6.

TABLE 5

| Starting materials (parts by weight) | Example 19 | Example 20 | Example 21 | Example 22 | Example 23 | Example 24 | Example 25 | Example 26 |
|---|---|---|---|---|---|---|---|---|
| EPT-PX055 | 20 | 0 | 0 | 0 | 20 | 10 | 20 | 20 |
| EPT-4010 | 0 | 20 | 0 | 0 | 0 | 10 | 0 | 0 |
| EPT-4021 | 0 | 0 | 20 | 0 | 0 | 0 | 0 | 0 |
| EPT-X3012P | 0 | 0 | 0 | 20 | 0 | 0 | 0 | 0 |
| Lucant HC10 | 0 | 0 | 0 | 0 | 0 | 0 | 5 | 10 |
| Lucant HC3000X | 30 | 30 | 30 | 30 | 30 | 30 | 25 | 30 |
| DIALEN 30 | 20 | 20 | 20 | 20 | 20 | 20 | 20 | 10 |
| DIALEN 208 | 30 | 30 | 30 | 30 | 30 | 30 | 30 | 30 |
| KBM-3103 | 6 | 6 | 6 | 6 | 6 | 6 | 6 | 6 |
| AS30 | 0 | 0 | 0 | 0 | 0 | 400 | 400 | 400 |
| UM | 0 | 400 | 0 | 0 | 0 | 0 | 0 | 0 |
| GP#1000 | 0 | 0 | 400 | 0 | 0 | 0 | 0 | 0 |
| PMIC-15 | 900 | 900 | 900 | 0 | 0 | 900 | 900 | 900 |
| PMIC-15F | 0 | 0 | 0 | 200 | 0 | 0 | 0 | 0 |
| BSF547 | 0 | 0 | 0 | 0 | 800 | 0 | 0 | 0 |
| Noise attenuation at 1 GHz (dB) | −11.0 | −11.5 | −11.4 | −12.2 | −5.5 | −11.0 | −11.2 | −11.1 |
| Plasticity at 25° C. | 340 | 360 | 450 | 500 | 390 | 420 | 290 | 310 |
| Thermal conductivity (W/mK) | 0.9 | 2.3 | 2.5 | 1.0 | 1.3 | 2.4 | 2.3 | 2.2 |
| Thermal resistance at 60° C. (° C./W) | 0.09 | 0.06 | 0.06 | 0.09 | 0.10 | 0.06 | 0.05 | 0.04 |
| Viscosity at 80° C. (Pa · s) | $1 \times 10^4$ | $5 \times 10^3$ | $6 \times 10^4$ | $8 \times 10^4$ | $3 \times 10^4$ | $3 \times 10^4$ | $2 \times 10^4$ | $8 \times 10^3$ |
| Thermosoftening point (° C.) | 40-80 | 40-80 | 40-80 | 40-80 | 40-80 | 40-80 | 40-80 | 40-80 |
| Sheet formability | good | good | good | good | good | good | good | good |
| Flexibility | fair | fair | fair | fair | fair | fair | good | good |
| Tack | fair | fair | fair | fair | fair | fair | fair | good |
| Handleability | fair | fair | fair | fair | good | good | good | fair |

TABLE 6

| Starting materials (parts by weight) | Example 27 | Example 28 | Example 29 | Example 30 | Example 31 | Comparative Example 2 | Comparative Example 3 | Comparative Example 4 |
|---|---|---|---|---|---|---|---|---|
| EPT-4010 | 10 | 10 | 10 | 10 | 10 | 0 | 0 | 10 |
| EPT-PX055 | 10 | 10 | 10 | 10 | 10 | 20 | 20 | 10 |
| Lucant HC40 | 10 | 10 | 10 | 10 | 10 | 0 | 0 | 0 |
| Lucant HC3000X | 20 | 20 | 20 | 20 | 30 | 30 | 30 | 30 |
| DIALEN 30 | 20 | 20 | 20 | 20 | 20 | 20 | 20 | 20 |
| DIALEN 208 | 30 | 30 | 30 | 30 | 30 | 30 | 30 | 30 |
| KBM-3103 | 6 | 6 | 6 | 6 | 6 | 6 | 6 | 6 |
| AS30 | 400 | 400 | 300 | 300 | 500 | 0 | 1200 | 0 |
| PMIC-15 | 600 | 0 | 0 | 300 | 100 | 1000 | 0 | 0 |
| PMIC-15F | 150 | 0 | 0 | 50 | 200 | 0 | 0 | 0 |
| MHT Permalloy PC | 0 | 900 | 0 | 450 | 100 | 0 | 0 | 0 |
| MHT410L-3Si | 0 | 0 | 1000 | 200 | 100 | 0 | 0 | 0 |
| Noise attenuation at 1 GHz (dB) | −14.0 | −12.0 | −11.5 | −15.0 | −15.6 | −13.0 | 0 | 0 |
| Plasticity at 25° C. | 400 | 430 | 440 | 440 | 440 | 400 | 310 | not measurable |
| Thermal conductivity (W/mK) | 2.4 | 2.3 | 2.2 | 2.4 | 2.3 | 1.8 | 3.0 | 0.3 |
| Thermal resistance at 60° C. (° C./W) | 0.03 | 0.04 | 0.05 | 0.03 | 0.05 | 0.09 | 0.03 | 1.2 |
| Viscosity at 80° C. (Pa·s) | $1.5 \times 10^3$ | $1 \times 10^4$ | $7 \times 10^2$ | $2 \times 10^4$ | $8 \times 10^3$ | $5 \times 10^4$ | $8 \times 10^3$ | 40 |
| Thermosoftening point (° C.) | 40-80 | 40-80 | 40-80 | 40-80 | 40-80 | 40-80 | 40-80 | not measurable |
| Sheet formability | excellent | good | good | good | good | good | good | poor |
| Flexibility | excellent | excellent | good | excellent | good | good | good | poor |
| Tack | excellent | excellent | excellent | excellent | good | good | good | poor |
| Handleability | excellent | excellent | excellent | excellent | good | good | good | poor |

Comparative Examples 5 to 8

For the sake of comparison, the results of physical property measurements and handleability tests carried out on commercially available silicone rubber heat dissipating sheets (0.5 mm thick, Comparative Examples 5 to 7) and a commercially available heat dissipating grease (Comparative Example 8) are shown below in Table 7.

TABLE 7

|  | Comparative Example 5 | Comparative Example 6 | Comparative Example 7 | Comparative Example 8 |
|---|---|---|---|---|
| Noise attenuation at 1 GHz (dB) | 0 | 0 | 0 | 0 |
| Thermal conductivity (W/mK) | 2.0 | 3.0 | 4.0 | 4.7 |
| Thermal resistance at 60° C. (° C./W) | 0.58 | 0.47 | 0.27 | 0.03 |
| Handleability | fair | fair | good | poor |

As is apparent from the above results, the thermosoftening electromagnetic wave absorbing heat dissipating sheets obtained in the examples of the invention have contact thermal resistances so much lower than those of silicone rubber heat dissipating sheets of comparable thermal conductivity as to be essentially negligible. Because of their low thermal resistances, the sheets of the invention had excellent heat dissipating performances and effectively dissipated the heat generated by electronic components. The sheets obtained in the examples according to the invention also exhibited a high noise attenuation, and thus had an excellent ability to absorb electromagnetic waves.

The invention thus provides both electromagnetic wave absorbing heat conductive compositions having an excellent ability to dissipate heat and excellent electromagnetic wave absorbing properties, and also thermosoftening electromagnetic wave absorbing heat dissipating sheets produced from such compositions.

The invention claimed is:

1. An electromagnetic wave absorbing heat dissipating device, comprising:
   a heat generating electronic component which, when operated, generates heat and reaches a temperature higher than room temperature and which generates electromagnetic waves; a heat dissipating component which faces the heat generating electronic component; and an electromagnetic wave absorbing, heat conductive composition positioned therebetween, said composition comprising an organic binder component which is a mixture of copolymers of polymers containing $RSiO_{3/2}$ units with $R_2SiO$ units, wherein R is methyl, phenyl or combinations thereof, with linear polysiloxanes, and an electromagnetic wave absorbing filler, wherein, when the device is in operation whereby the heat generating electronic component generates heat, and reaches a temperature higher than room temperature, and generates electromagnetic waves, the heat causing the organic binder component to fluidize as a low viscosity material, or to soften or to melt to the extent that at least a surface of the composition is fluidized with the result that the composition flows and substantially fills any gaps between the heat generating electronic component and the heat-dissipating component, said composition having a thermal conductivity of at least 0.5 W/mK and a viscosity at 80° C. of $1 \times 10^2$ to $1 \times 10^5$ Pa·s.

2. The device of claim 1, wherein the composition is curable by a crosslinking reaction.

3. The device of claim 1, wherein the composition further comprises a low melting substance having a melting point of 40 to 100° C., a heat flowable substance which softens or acquires a low viscosity and becomes fluid at a temperature of 40 to 100° C., or a syrupy substance at a temperature of 40 to 100° C.

4. The device of claim 1, wherein the composition further comprises at least one component having a melting point of 40 to 100° C. selected from the group consisting of α-olefins, waxes and silicone resins.

5. The device of claim 1, wherein the composition further comprises a heat conductive filler, and wherein the temperature that effectively has a viscosity lowering, softening or melting effect on the organic binder is at least 40° C.

6. The device of claim 1, wherein the electromagnetic wave absorbing filler is at least one substance selected from the group consisting of ferromagnetic metal powders and ferromagnetic oxide powders.

7. The device of claim 5, wherein the heat conductive filler is at least one material selected from the group consisting of nonmagnetic metals, metal oxides, metal nitrides and silicon carbide.

8. The device of claim 5, wherein the electromagnetic wave absorbing filler and the heat conductive filler each range in particles size from 0.1 to 100 μm.

* * * * *